United States Patent [19]
Mehdizadeh et al.

[11] Patent Number: 4,879,516

[45] Date of Patent: Nov. 7, 1989

[54] PRECISION ELECTRICAL ADJUSTMENT OF QUADRATURE COIL ISOLATION

[75] Inventors: Mehrdad Mehdizadeh, University Hts.; John L. Patrick, Euclid; George J. Misic, Novelty, all of Ohio

[73] Assignee: Picker International, Inc., Highland Hts., Ohio

[21] Appl. No.: 199,202

[22] Filed: May 26, 1988

Related U.S. Application Data

[63] Continuation-in-part of Ser. No. 120,475, Nov. 13, 1987, Pat. No. 4,839,594, and a continuation-in-part of Ser. No. 86,277, Aug. 17, 1987, Pat. No. 4,841,248, and a continuation-in-part of Ser. No. 931,726, Nov. 17, 1986, Pat. No. 4,752,738, and a continuation-in-part of Ser. No. 765,708, Aug. 14, 1985, Pat. No. 4,793,356.

[51] Int. Cl.⁴ ............................................. G01R 33/20
[52] U.S. Cl. ..................................... 324/318; 324/322
[58] Field of Search ............... 324/311, 318, 322, 309, 324/307; 336/225; 333/222

[56] References Cited

U.S. PATENT DOCUMENTS

| | | | |
|---|---|---|---|
| 4,467,282 | 8/1984 | Siebold | 324/309 |
| 4,631,481 | 12/1986 | Young et al. | 324/320 |
| 4,633,179 | 12/1986 | Sugimoto | 324/309 |
| 4,638,253 | 1/1987 | Jaskolski | 324/318 |
| 4,649,348 | 3/1987 | Flugan | 324/318 |
| 4,680,551 | 7/1987 | O'Donnell et al. | 324/320 |
| 4,695,801 | 9/1987 | Arakawa et al. | 324/318 |
| 4,698,611 | 10/1987 | Vermilyea | 335/298 |
| 4,700,136 | 10/1987 | Yamaguchi et al. | 324/309 |
| 4,706,027 | 11/1987 | Hughes | 423/309 |
| 4,707,664 | 11/1987 | Fehn | 324/322 |
| 4,713,614 | 12/1987 | Hoshino et al. | 324/307 |
| 4,717,881 | 1/1988 | Flugan | 324/322 |
| 4,740,752 | 4/1988 | Arakawa et al. | 324/311 |
| 4,763,074 | 8/1988 | Fox | 324/314 |
| 4,769,605 | 9/1988 | Fox | 324/322 |

FOREIGN PATENT DOCUMENTS 2149124  6/1985  United Kingdom .

OTHER PUBLICATIONS

Fox, T. R. "Capacitive Network to Cancel Coupling Between Channels in MRI Quadrature Antenna" SMRM Book of Abstracts, vol. 1, p. 99, 1987.
Hoult, D. I., et al., "Quadrature Detection in the Laboratory Frame", Mag. Res. in Medicine 1,339-353, 1984.

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

A magnetic resonance imager includes a quadrature coil assembly (20) for transmitting radio frequency signals into and receiving magnetic resonance signal from an examination region. The quadrature coils assembly includes a first coil (22) and a second coil (24). A shunt path (32, 64, 74, 84, 94, 98, 100, 112, 114, 122) provides a current path by shunting at least a portion of one of the coils. A variable impedance (34, 66, 76, 86, 96, 110, 120) adjusts the amount of current flow through the shunt path and the current flow through the bypassed coil portion. More specifically, adjusting the impedance changes the magnetization vector generated by the coil assembly in a transmit mode and adjusts their relative isolation in a receive mode. The quadrature coils are mounted such that they are offset by about, but not quite, 90°. The variable impedance is adjusted until the offset is brought precisely to 90°. In this manner, the quadrature coils are adjusted electronically after assembly to insure the precision of their isolation.

15 Claims, 6 Drawing Sheets

PRECISION ELECTRICAL ADJUSTMENT OF QUADRATURE COIL ISOLATION

The present application is a continuation-in-part of prior pending U.S. application Ser. No. 120,475, filed Nov. 13, 1987 now U.S. Pat. No. 4,839,594; Ser. No. 086,277, filed Aug. 17, 1987 now U.S. Pat. No. 4,841,248; Ser. No. 931,726, filed Nov. 17, 1986 now U.S. Pat. No. 4,752,738; and Ser. No. 765,708, filed Aug. 14, 1985 now U.S. Pat. No. 4,793,356.

BACKGROUND OF THE INVENTION

The present invention relates to radio frequency coil design and construction. It finds particular application in conjunction with quadrature coils for use in magnetic resonance imaging systems and will be described with particular reference thereto. However, it is to be appreciated that the present invention will find application in magnetic resonance spectroscopy, and other fields in which the isolation of multiple coils or the angle of magnetic field vector is adjusted or calibrated.

Heretofore, magnetic resonance imaging and spectroscopy equipment has utilized quadrature reception coils to boost signal strength. Commonly, the quadrature coils include two pairs of oppositely disposed saddle coils. The pairs of oppositely disposed saddle coils were rigidly mounted offset precisely 90° relative to each other. When the pairs of coils were exactly the same and mounted exactly 90° apart, the radio frequency signals received by each pair were isolated from each other. However, even a small difference in the coils or deviation from a precise 90° relationship resulted in a loss of isolation and a rapid decrease in the signal strength.

One common technique for isolating the quadrature coils has been to distort the electromagnetic field with shims or paddles. That is, metallic elements were disposed adjacent the quadrature coils in sufficient proximity that the magnetic fields were distorted. The position and orientation of the paddles were adjusted until isolation of the two coil pairs were maximized. One of the problems with paddles is that they modified or distorted the magnetic field pattern. The modification of the field pattern were relatively unpredictable. Conversely, the location in which to place a paddle to effect a selected correction was also unpredictable. This lack of predictability caused the manufacturing and final calibration to be time consuming and difficult.

In another tecnique, each coil pair was mounted on a separate, circularly cylindrical dielectric former. The formers were concentrically mounted such that one pair of coils could be rotated relative to the other pair. The position or rotation of the formers were adjusted until the isolation was maximized. One of the problems with the concentric former technique was the complexity of achieving and maintaining rigid, precise alignment. In a 30 centimeter coil, a linear movement of 0.5 mm, which is equivalent to 0.15° of rotation caused a loss of effective coil isolation of 40 to 20 db.

It has also been suggested that the isolation might be adjusted by connecting a two part capacitive network to the feed points of the two coils. However, connecting the two port capacitive network to the relatively spaced feed points of the coils tended to create stray effects, particularly at higher frequencies.

In accordance with the present invention, a new and improved technique is provided for electrically adjusting the isolation between quadrature or other coil pairs.

SUMMARY OF THE INVENTION

In accordance with one aspect of the present invention, a quadrature coil assembly is provided. A first coil is fixedly mounted generally transverse to a second coil. A shunt current path is provided along a portion of at least one of the coils. Means are provided for adjusting current flow through the shunt path to adjust the relative isolation of the first and second coils.

In accordance with another aspect of the present invention, a quadrature coil assembly is provided having a first coil that creates a first magnetic field along a first axis. A second coil creates a second magnetic field along a second axis. A magnetic field adjusting means is operatively connected with at least one of the coils for altering its electrical properties to rotate the first and second axes relative to each other.

In accordance with yet another aspect of the present invention, a method of calibrating quadrature coil is provided. First and second coils are mounted about 90° offset from each other. Current flow through at least a portion of one of the coils is adjusted until isolation of the coils is maximized in a receive mode or until generated magnetic fields are perpendicular in a transmit mode.

In accordance with a more limited aspect of the present invention, a magnetic resonance imaging apparatus is provided incorporating a quadrature coil assembly calibrated in accordance with the present invention.

One advantage of the present invention is that it simplifies and expedites fine adjustment of quadrature coil isolation.

Another advantage of this invention is the stability of the isolation after set-up of the coil is completed compared to mechanical adjustment methods.

Another advantage of the present invention resides in the precision and accuracy of isolation adjustment.

Yet another advantage of the present invention is that it is applicable to all frequency ranges.

Still further advantages of the present invention will be apparent to those of ordinary skill in the art upon reading and understanding the following detailed description of the preferred embodiments.

BRIEF DESCRIPTION OF THE DRAWINGS

The present invention may take form in various components and arrangements of components or in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
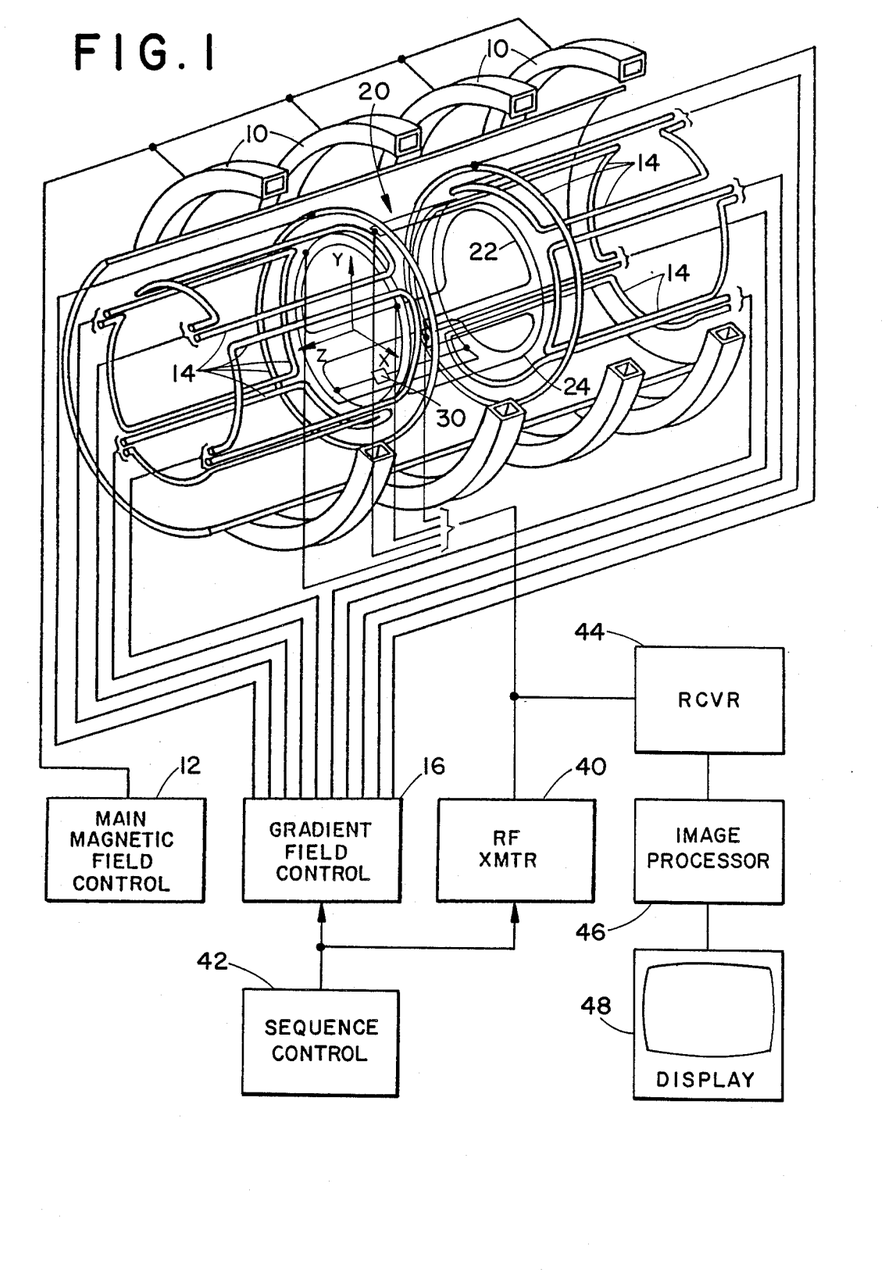
FIG. 1 is a diagrammatic illustration of a magnetic resonance imaging apparatus incorporating the present invention.

With reference to FIG. 1, magnets 10 under the control of a main magnetic field control means 12 generate a generally uniform main magnetic field longitudinally through an image or examination region. Gradient field coils 14 convert electrical pulses from a gradient field control means 16 into magnetic field gradients across the main magnetic field. Conventionally, the gradients are applied along three orthogonal axes x, y, and z. A quadrature coil assembly 20 transmits radio frequency pulses into the examination region and receives radio frequency magnetic resonance signals therefrom. In the illustrated embodiment, the quadrature coil assembly includes a first saddle coil 22 and a second saddle coil 24. An isolation adjusting means 30 is connected with at least one of the saddle coils for selectively rotating the magnetic field generated by the coils and therefore adjusting the isolation between the first and second coils. In the illustrated embodiment, the isolation adjusting means includes a shunt path across a part of one of the coils. An adjustable impedance selectively adjusts current flow through the shunt path.

A radio frequency transmitter 40 selectively drives the quadrature coil assembly with radio frequency pulses. An imaging sequence controller 42 controls the gradient field control means 16 and the radio frequency transmitter 40 in order to create preselected imaging pulse sequences. The quadrature coil assembly 20 functions as an antenna for a receiver 44 which receives magnetic resonance signals emanating from the examination region. An image processor 46 reconstructs an image representation from the received magnetic resonance data utilizing conventional algorithms. The image or otherwise processed data may be displayed on a display 48, stored in memory, subject to further processing, or the like.

Figure 2:
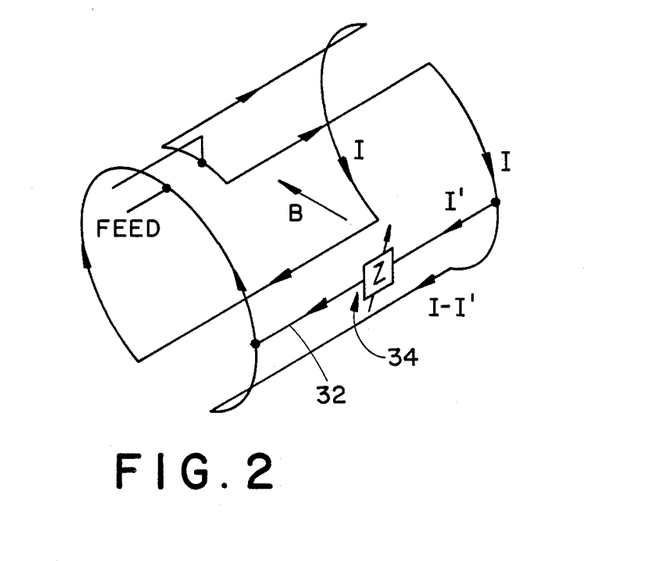
FIG. 2 is a diagrammatic illustration of a saddle coil assembly in accordance with the present invention.
Figure 3:
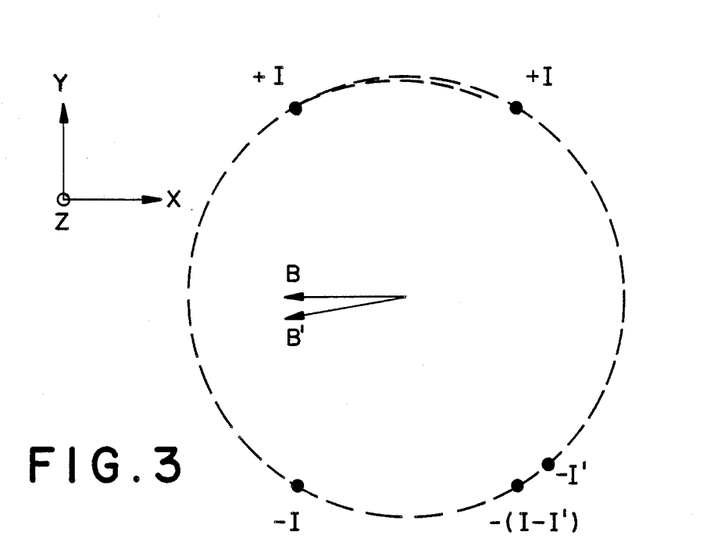
FIG. 3 is a cross sectional view of the saddle coil of FIG. 1 illustrating rotation of the magnetic field with adjustment of shunt path reactance.

With reference to FIGS. 2 and 3, either of saddle coils 22, 24 under a constant current I produce a magnetic field B. A shunt path 32 alters the current flow in coil 24. As an adjustable impedance 34 permits a current flow through the shunt path 32, a by-pass current flow I' is created. The new coil configuration produces a magnetic field B' which is rotated relative to the original magnetic field B. As the current through the shunt becomes greater, the angle of rotation of the magnetic fields increases.

Figure 4:
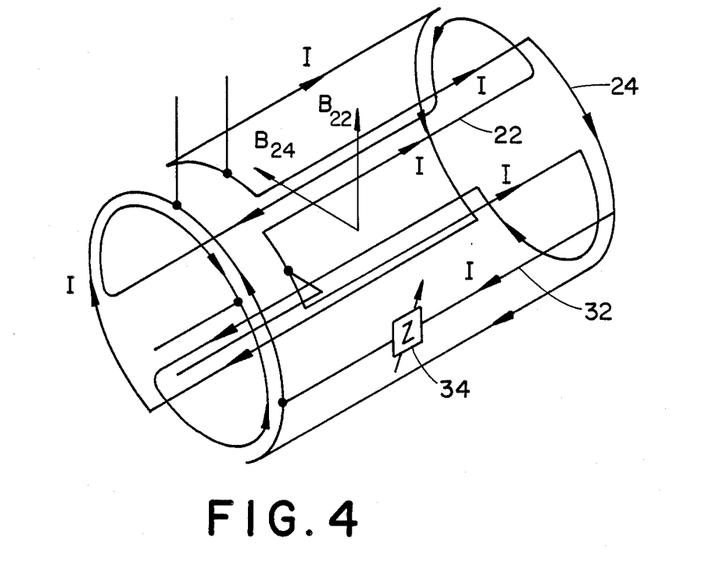
FIG. 4 illustrates a quadrature saddle coil assembly in accordance with the present invention.

With reference to FIG. 4, the coil 22 causes a magnetic field $B_{22}$ and the coil 24 produces a magnetic field $B_{24}$ when the current I is applied therethrough. By adjusting the impedance 34, the magnetic field $B_{24}$ is rotated relative to $B_{22}$. Conventional test equipment is interconnected with the quadrature coil assembly 20 to monitor the isolation between the two coils. Conventional test equipment measures the isolation between the coils as the impedance 34 is adjusted until the isolation is maximized.

Figure 5:
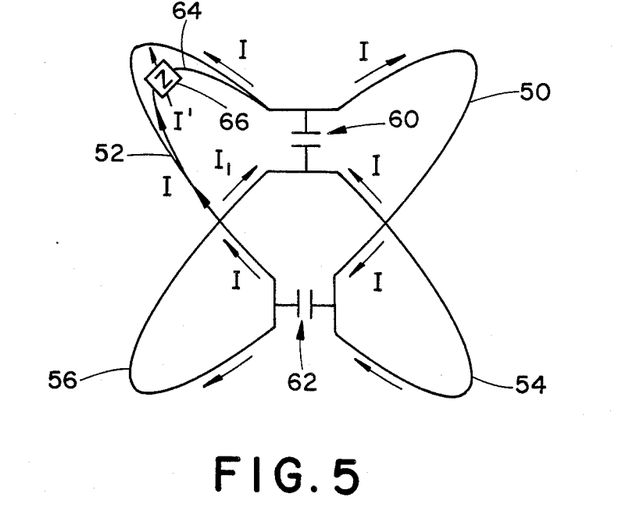
FIG. 5 is a cross ellipse coil assembly in accordance with the present invention.

In the embodiment of FIG. 5, the first coil includes two elliptical coil portions 50, 52 and the second coil includes two like elliptical coils 54, 56. Capacitive coupling means 60, 62 interconnect the two coil pairs. The isolation adjusting means includes a shunt path 64 and a variable reactive impedance 66 for adjusting current flow therethrough.

Figure 6:
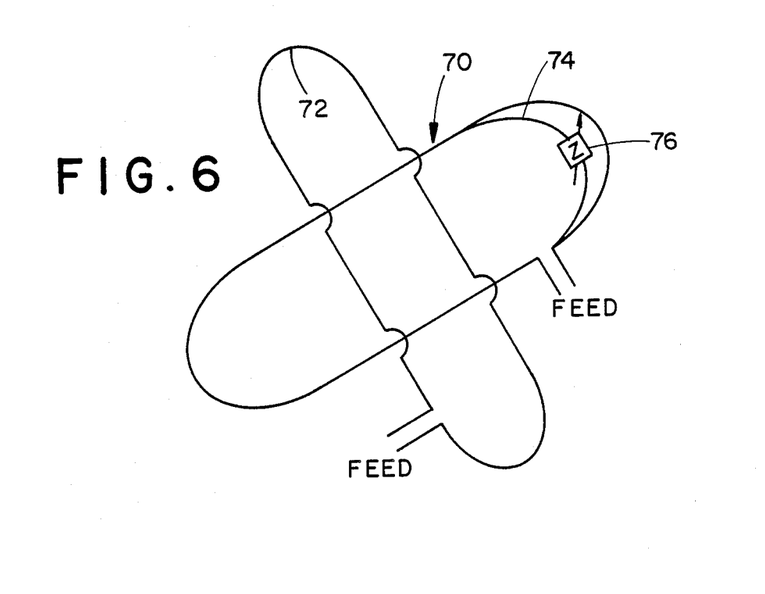
FIG. 6 illustrates a crossed single loop coil assembly in accordance with the present invention.

With reference to FIG. 6, a first single loop coil 70 is disposed generally transverse to a second single loop coil 72. Current flow through a shunt path 74 is controlled by a variable capacitor 76 or other appropriate variable reactance.

Figure 7:
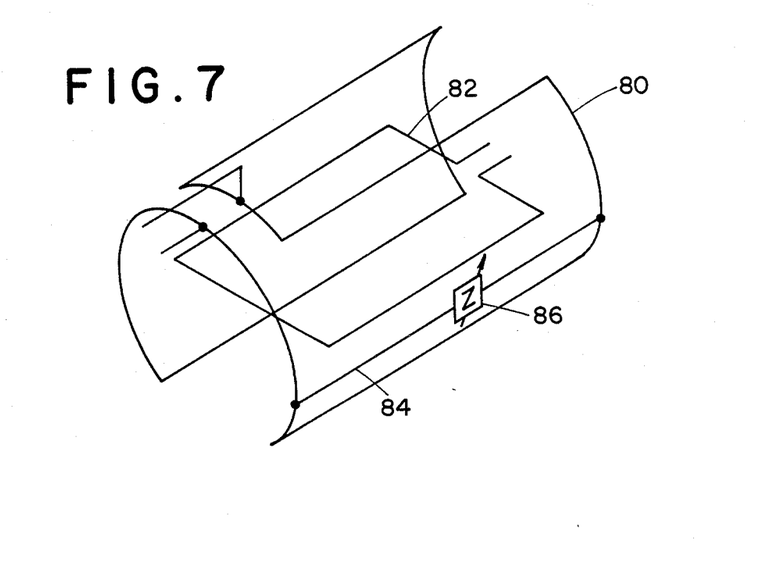
FIG. 7 illustrates a saddle coil and single loop planar coil in accordance with the present invention.

With reference to FIG. 7, the first coil is a saddle coil 80 and the second coil is a planar, loop coil 82. Current flow along a shunt path 84 across a portion of one of the coils is controlled by a variable reactive impedance 86. Although shown as a shunt path along the saddle coil 80, it is to be appreciated that analogous results might be achieved by connecting the shunt path along the loop coil 82.

Figure 8:
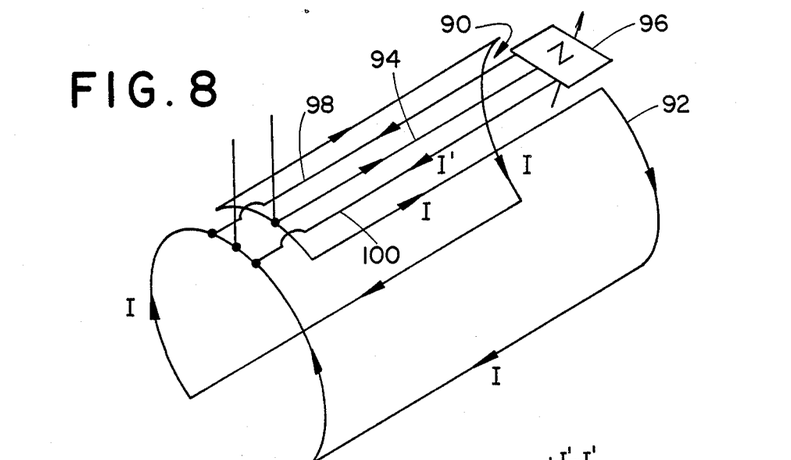
FIG. 8 is yet another alternate embodiment of the present invention in which an additional loop is introduced into the assembly.
Figure 9:
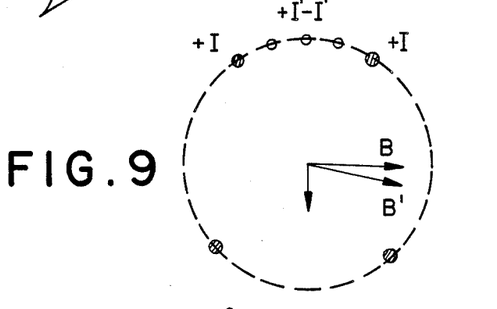
FIG. 9 is a cross sectional view of the coil of FIG. 8 illustrating magnetic field rotation.

With reference to FIGS. 8 and 9, the magnetization rotation means defines a separate loop 90 relative to a saddle coil 92. In the illustrated embodiment, the isolation adjustment means includes a first conductive segment 94 connected from one portion of the coil to a variable impedance means 96. Second and third loop segments 98, 100 connects the variable impedance with another portion of the coil. The first, second, and third conductive segments are connected symmetrically with the saddle coil 92. The adjustable impedance means adjusts the relative current flow and current flow direction through the loop 90. The selection of the net current direction selects the direction of magnetic field rotation and adjusting the relative current flow adjusts the amount of rotation.

Figure 10:
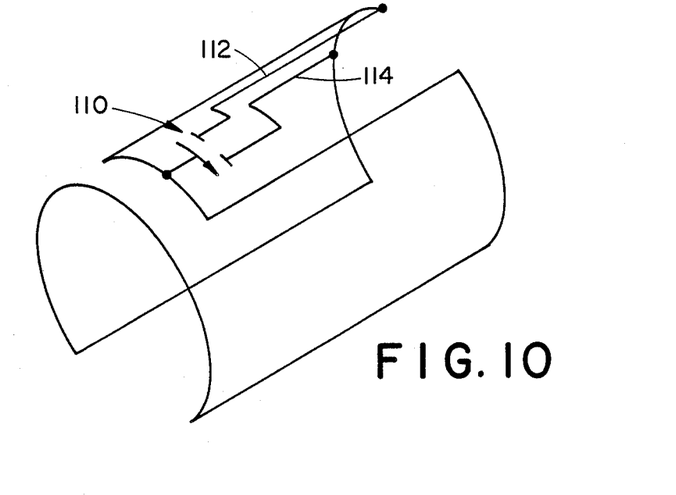
FIG. 10 illustrates another alternate embodiment of the present invention in which the magnetization is rotatable in either direction.

In the embodiment of FIG. 10, the magnetic field is again rotatable in either direction. An adjustable differential capacitor 110 selects the relative impedance in each of paths 112 and 114. Current flowing along path 112 tends to rotate the magnetization in one direction and current flowing along path 114 tends to rotate the magnetization in the other direction.

Figure 11:
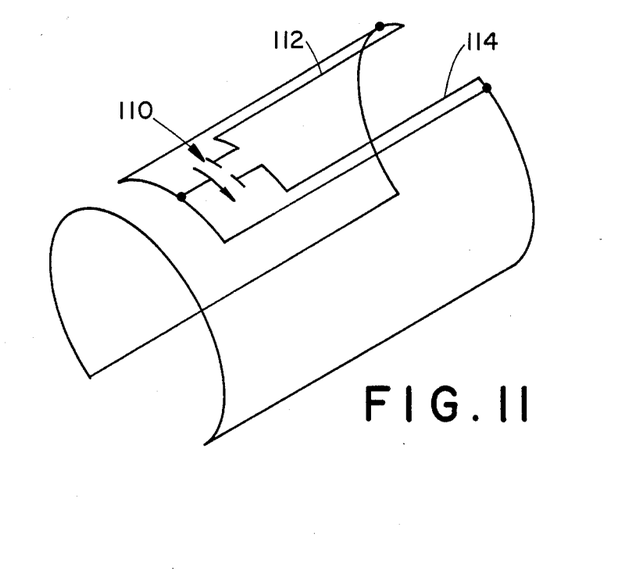
FIG. 11 provides yet another alternate embodiment in which the magnetization is rotatable in either direction; and, FIG. 12 is another alternate embodiment of the present invention in which the impedance of the adjustment network, and therefore the isolation is preferably adjustable.

In the embodiment of FIG. 11, the differential capacitor 110 is symmetrically located for adjustably distributing the current between coil shunt paths 112 and 114 associated with different portions of the saddle coil.

Figure 12:
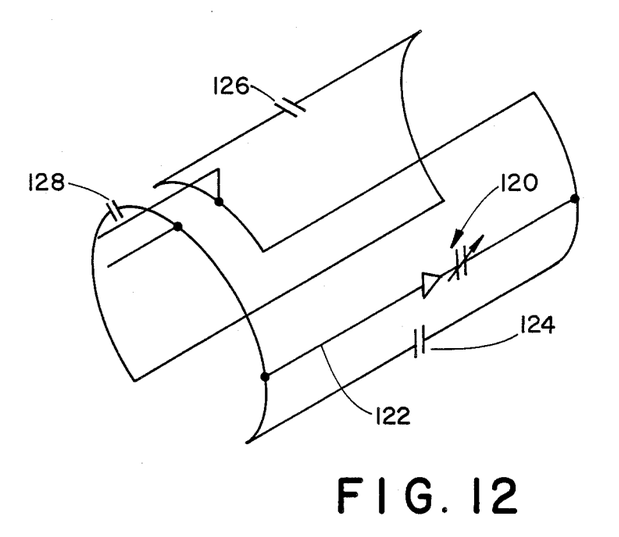

In the embodiment of FIG. 12, a varactor 120 is mounted along a shunt path 122 adjacent one portion of the saddle coil. The capacitance of the varactor is adjusted by adjusting a DC bias applied thereacross, i.e. superimposed on the radio frequency feed for the coil. DC blocking capacitors 124, 126, 128 are disposed along the coil arrangement in order to prevent DC bias voltage from being shorted by the coil conductor, while allowing RF current to pass.

When preparing a quadrature or other two coil arrangement, the two coils are mounted generally perpendicular. Preferably, the two coils are intentionally mounted a small amount off from an exact 90° offset, e.g. $\frac{1}{2}°$ to 2°, in a selected direction. The magnetic field adjusting means is adjusted to rotate the magnetic field of one of the coils opposite to the selected direction. The isolation of the coils is monitored with conventional network analyzing equipment until the isolation is maximized. The magnetic field means is then set and the calibration is completed.

The invention has been described with reference to the preferred embodiments. Obviously, alterations and variations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A magnetic resonance apparatus comprising:
a main magnetic field means for generating a main magnetic field;
a radio frequency transmitter for transmitting radio frequency signals;
a radio frequency receiver for receiving radio frequency magnetic resonance signals;
a quadrature coil assembly mounted adjacent the magnetic field and operatively connected with at least one of the radio frequency transmitter and receiver, the quadrature coil assembly including a first coil, a second coil, and a shunt path for adjusting relative isolation of the first and second coils, at least one of the first and second coils being a saddle coil, under a constant current, the first coil generates a magnetic field in a first direction and the second coil generates a magnetic field in a second direction, the first and second directions being at a generally perpendicular angle relative to each other; and
a means for adjusting current flow along the shunt path such that the shunt path current adjusting means adjusts the relative angle of the first and second directions.

2. The apparatus as set forth in claim 1 wherein the first and second coils are both saddle coils.

3. A magnetic resonance apparatus comprising:
a main magnetic field means for generating a main magnetic field;
a radio frequency transmitter for transmitting radio frequency signals;
a radio frequency receiver for receiving radio frequency magnetic resonance signals;
a quadrature coil assembly mounted adjacent the magnetic field and operatively connected with at least one of the radio frequency transmitter and receiver, the quadrature coil assembly including a first coil that generates a magnetic field in a first direction and a second coil that generates a magnetic field in a second direction, the first and second directions being at a generally perpendicular angle relative to each other; and
an adjustable, differential capacitor mounted in a shunt path for adjusting relative isolation of the first and second coils.

4. A magnetic resonance apparatus comprising:
a main magnetic field means for generating a main magnetic field;
a radio frequency transmitter for transmitting radio frequency signals;
a radio frequency receiver for receiving radio frequency magnetic resonance signals;
a quadrature coil assembly mounted adjacent the magnetic field and operatively connected with at least one of the radio frequency transmitter and receiver, the quadrature coil assembly including a first coil that generates a magnetic field in a first direction and a second coil that generates a magnetic field in a second direction, the first and second directions being at a generally perpendicular angle relative to each other; and
a varicap diode mounted in a shunt path for adjusting relative isolation of the first and second coils.

5. The apparatus as set forth in claim 4 further including a plurality of capacitors operatively connected with the first and second coils for blocking a DC component applied to the varicap diode for adjusting its reactance.

6. A magnetic resonance apparatus comprising:
a main magnetic field means for generating a main magnetic field;
a radio frequency transmitter for transmitting radio frequency signals;
a radio frequency receiver for receiving radio frequency magnetic resonance signals;
a quadrature coil assembly mounted adjacent the magnetic field and operatively connected with at least one of the radio frequency transmitter and receiver, the quadrature coil assembly including a first coil that generates a magnetic field in a first direction and a second coil that generates a magnetic field in a second direction, the first and second directions being at a generally perpendicular angle relative to each other;
a shunt path that includes a first segment extending generally parallel to the main magnetic field; and,
a shunt path control means for controlling the amount of current flowing through the first segment for adjusting the relative angle of the first and second directions.

7. The apparatus as set forth in claim 6 wherein the shunt path further includes a second segment disposed in one circumferential direction from the first segment and a third segment disposed in an opposite circumferential direction from the first segment, the shunt path control means being connected between the first, second, and third segments for selecting relative current flow among the three segments.

8. A magnetic resonance apparatus comprising:
a means for creating a main magnetic field along a main field axis;
a first coil for creating a first magnetic field component along a first axis;
a second coil for creating a second magnetic field component along a second axis;
a shunt path which shunts a portion of the first coil, the shunt path having at least a segment in which current flowing therethrough has a component parallel to the main field axis;
a means for selectively adjusting relative current flow through the shunt path and the shunted first coil portion to rotate the first and second axes relative to each other.

9. The apparatus as set forth in claim 8 wherein the shunted first coil portion includes a coil segment in which current flowing therethrough has a component parallel to the main field axis.

10. The apparatus as set forth in claim 8 wherein the means for selectively adjusting relative current flow includes an adjustable reactance.

11. The apparatus as set forth in claim 10 wherein the main field axis, the first axis, and the second axis are generally perpendicular to each other.

12. A magnetic resonance apparatus comprising:
a main magnetic field means for creating a main magnetic field along a main field axis;
a radio frequency transmitter for transmitting radio frequency signals;
a radio frequency receiver for receiving radio frequency signals;
a quadrature coil assembly mounted adjacent the main magnetic field and having a pair of feed points which are operatively connected with at least one of the radio frequency transmitter and receiver, the quadrature coil assembly including a first coil loop extending from one of the feed points to the other and a second coil loop extending in a second coil pattern between the two feed points, a shunt path extending across a shunted portion of the first coil loop remote from the feed points, and a reactance means for adjusting relative current flow through the shunt path and the shunted first coil portion.

13. A quadrature coil assembly comprising:
a pair of feed points;
a first current loop extending from the feed points along a first coil pattern in a receiving mode the first coil loop having a maximum sensitivity along a first axis and in a transmitting mode transmitting a magnetic field along the first axis;
a second coil extending between the first and second feed points in a second coil pattern, the second coil loop in a receiving mode having a peak sensitivity to magnetic fields along a second axis and in a transmitting mode generating a magnetic field along the second axis, the first and second coil loops being mounted relative to each other such that the first and second axes have generally a preselected angular relationship; and,
a means connected across only a portion of the first loop for adjusting the relative angle between the first and second axes.

14. A quadrature coil assembly for a magnetic resonance apparatus, the quadrature coil assembly comprising:
a pair of feed points;
a first coil loop extending in a first coil pattern from one feed point to the other, the first coil pattern having at least a first coil segment oriented such that current flowing through the first coil segment has a component in a first direction;
a second coil loop extending in a second coil pattern from one feed point to the other, the second coil pattern having at least a second coil segment oriented such that current flowing through the second coil segment has a component parallel to the first direction;
a shunt path which shunts the first coil segment, the shunt path having a shunt path segment oriented such that current flowing through the shunt path segment has a component parallel to the first direction; and,
a means for adjusting relative current flow through the first coil segment and the shunt path segment.

15. The coil as set forth in claim 14 wherein the first coil segment, second coil segment, and the shunt path segment all include linear segments disposed parallel to each other.

* * * * *